(12) United States Patent
Gardner et al.

(10) Patent No.: US 6,777,810 B2
(45) Date of Patent: Aug. 17, 2004

(54) INTERCONNECTION ALLOY FOR INTEGRATED CIRCUITS

(75) Inventors: Donald S. Gardner, Mountain View, CA (US); Thomas N. Marieb, San Francisco, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/253,306

(22) Filed: Feb. 19, 1999

(65) Prior Publication Data

US 2002/0093103 A1 Jul. 18, 2002

(51) Int. Cl.⁷ .......................... H01L 23/48; H01L 23/52; H01L 29/40
(52) U.S. Cl. .................. 257/762; 257/763; 257/764; 257/765; 257/771
(58) Field of Search ................................ 257/762–765, 257/771

(56) References Cited

U.S. PATENT DOCUMENTS

| | | | |
|---|---|---|---|
| 4,673,623 A | | 6/1987 | Gardner et al. |
| 4,999,160 A | * | 3/1991 | Lowrey et al. .............. 420/529 |
| 5,243,221 A | * | 9/1993 | Ryan et al. .................. 257/758 |
| 5,635,763 A | * | 6/1997 | Inoue et al. ................. 257/763 |
| 5,641,992 A | * | 6/1997 | Lee et al. .................... 257/762 |
| 5,665,643 A | * | 9/1997 | Shin ........................... 438/763 |
| 5,736,192 A | * | 4/1998 | Okamoto ...................... 427/99 |
| 5,747,361 A | * | 5/1998 | Ouellet ....................... 438/627 |
| 6,277,730 B1 | * | 8/2001 | Yuasa et al. ................. 257/758 |

FOREIGN PATENT DOCUMENTS

| | | | | |
|---|---|---|---|---|
| JP | 4-17338 | * | 1/1992 | ....... H01L/21/3205 |
| JP | 4-35035 | * | 2/1992 | ....... H01L/21/3205 |

* cited by examiner

Primary Examiner—Thien F Tran
(74) Attorney, Agent, or Firm—Blakely, Sokoloff, Taylor & Zafman LLP

(57) ABSTRACT

An interconnection of an aluminum-copper-titanium alloy containing about 0.1 atomic percent titanium.

13 Claims, 4 Drawing Sheets

INTERCONNECTION ALLOY FOR INTEGRATED CIRCUITS

BACKGROUND OF THE INVENTION

1. Field of the Invention

The invention relates generally to integrated circuits and more particularly to interconnecting individual devices of an integrated circuit.

2. Background Information

One direction in improving integrated circuit technology is to reduce the size of the components or devices on the integrated circuit chip, permitting an increased number of devices on the chip. The reduction in size of the devices of an integrated circuit chip requires reductions in the widths and thicknesses of the interconnections that connect the devices on the chip.

In general, the primary concerns of interconnection material is the material's longevity and its resistivity. Typically, modern interconnections are made principally of aluminum or an aluminum alloy, such as an aluminum-copper (Al—Cu) alloy or aluminum-silicon (Al—Si) alloy.

In general, grain boundaries are formed by the aluminum crystals that make up the aluminum or aluminum alloy interconnection. At present, the "micron" width and the "angstrom" thickness of a typical interconnection has become so small that interactions between the current flowing through the interconnection and the grain boundaries between the aluminum crystals increasingly determine the limits in performance, reliability, and power consumption.

Where three grain boundaries meet, a triple point junction is formed. Such junctions are randomly dispersed throughout the interconnection and extend in a variety of directions that define potential inlet and outlet routes for displaced aluminum atoms during current flow. As electrical current flows through the interconnection, aluminum atoms are displaced the electrons. These displaced aluminum atoms accumulate in the grain boundaries that are downstream of the current and travel along the grain boundaries in the general direction of the current. At grain boundary junctions that have fewer upstream inlets than downstream outlets, a void may develop at that grain boundary junction in the interconnection over time as aluminum atoms erode from the junction.

FIG. 1 schematically illustrates an aluminum alloy interconnection and shows a number of junctions created by adjacent aluminum crystals. Interconnection 70 is formed, in this example, by a portion of aluminum crystal 72, a portion of aluminum crystal 74, a portion of aluminum crystal 76, a portion of aluminum crystal 78, and a portion of aluminum crystal 80. Grain boundary junction 82 is formed by the meeting of inlet grain boundary 84, outlet grain boundary 86, and outlet grain boundary 88, the designation of inlet and outlet being dictated by the indicated direction of the flow of electrons. With one upstream inlet and two downstream outlets, more aluminum atoms can be expected to leave junction 82 through the two downstream outlets 86 and 88 than are supplied into junction 82 through the one upstream inlet 82. With more aluminum atoms being removed from junction 82 within interconnection 70 than are being supplied to junction 82 from its upstream source, here inlet grain boundary 84, void 90 eventually will develop in interconnection 70 at junction 82.

The movement of aluminum atoms within an aluminum interconnection is known as electromigration and the time it takes for a void to develop into an open circuit in the interconnection may be described as the electromigration lifetime. One way to increase performance, reliability, and power consumption of integrated circuit interconnections is by improving the electromigration lifetime.

Several techniques have been developed to improve the electromigration lifetime of an interconnection. These techniques include improved texture, interlayers to limit void size, and interconnections of multiple layers of material such as a pure aluminum layer as well as different layers formed from aluminum alloys.

A second concern of interconnections is resistivity. U.S. Pat. No. 4,673,623, demonstrated that an alloy of aluminum, silicon, and titanium (Al—Si—Ti) provides hillock-free, dry-etchable, low resistivity electromigration resistant interconnections. Prior to the Al—Si—Ti alloy, interconnections of both aluminum-silicon (Al—Si) and aluminum-silicon-copper (Al—Si—Cu) were utilized. Although adding copper to aluminum-silicon improved the performance of the interconnection, the replacement of copper with titanium dramatically improved the performance of the interconnection by reducing the resistivity over an Al—Si—Cu interconnection.

What is needed is an electrical interconnection and an interconnection system with improved performance and reliability.

SUMMARY OF THE INVENTION

An interconnection of an aluminum-copper-Group IVA metal alloy is disclosed.

DETAILED DESCRIPTION OF THE INVENTION

The invention discloses an interconnection formed, for example, on a substrate of an integrated circuit chip where the material used to form the interconnection includes an aluminum-copper-Group IVA metal alloy. A Group IVA metal is a designation according to the International Union of Pure and Applied Chemistry (IUPAC) of elements having similar properties corresponding to their atomic structure. The interconnection and interconnection system as described herein has an increased electromigration lifetime by at least a factor of two with minimal impact on resistivity when compared to prior art interconnections.

A common method of utilizing interconnections in integrated circuits includes, but is not limited to, as part of a multilayer interconnection structure or interconnection stack. Examples include placing the primary interconnection material, such as for example an aluminum alloy, between titanium and/or titanium nitride (TiN) or between tantalum (Ta) and/or tantalum nitride (TaN). The titanium or tantalum materials act, in one sense, as diffusion barriers between the primary interconnection material and other layers above or below the primary interconnection material.

Reference is made to FIGS. 2 to 6 to illustrate an interconnection stack and its manufacturing steps according to one embodiment of the invention. The interconnection stack will connect, for example, individual devices on a chip or signals to or from the chip. A typical chip might have interconnection stacks made up of five or more layers, each interconnection stack separated from other interconnection stacks by interlayer dielectric (ILD) material. FIGS. 2 to 6 describe the formation of an interconnection stack according to an embodiment of the invention over ILD on a semiconductor substrate, such as, for example, a silicon substrate having a plurality of devices formed in and on the substrate. The interconnection stack described is a Ti/TiN/Al—Cu-Group IV metal/Ti/TiN stack.

Figure 1:
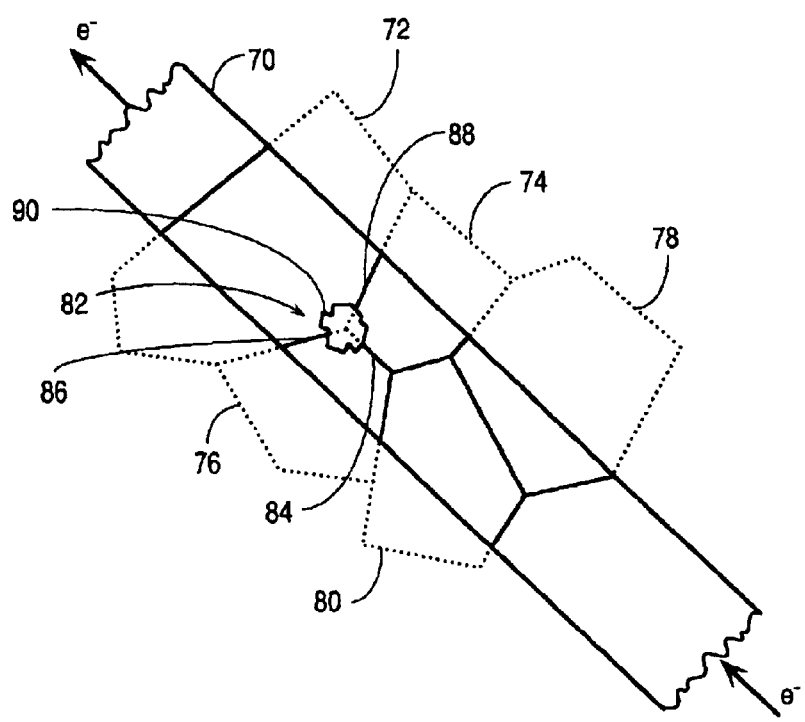
FIG. 1 is a schematic illustration of the grain boundaries of aluminum crystals in an aluminum alloy interconnection.
Figure 2:
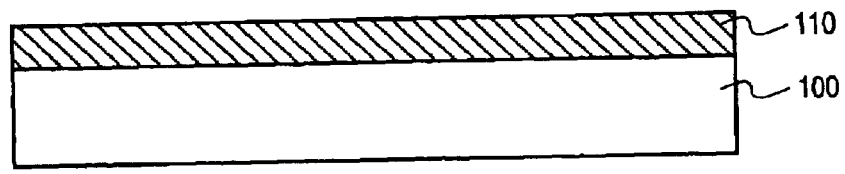
FIG. 2 is a cross-section schematic of a titanium (Ti) underlayer on an interlayer dielectric in accordance with an embodiment of an interconnection stack of the invention.

FIG. 2 shows the substrate after the processing step of patterning titanium (Ti) layer 110 over ILD layer 100. To form an interconnection stack having a thickness of, for example, 4500 Å to 5000 Å, titanium layer 110 is deposited to a thickness of, for example, 400 Å by use of DC magnetron sputtering in an atmosphere of argon at a total pressure of 5 mTorr, with a deposition rate of approximately 20 Å/second.

Figure 3:
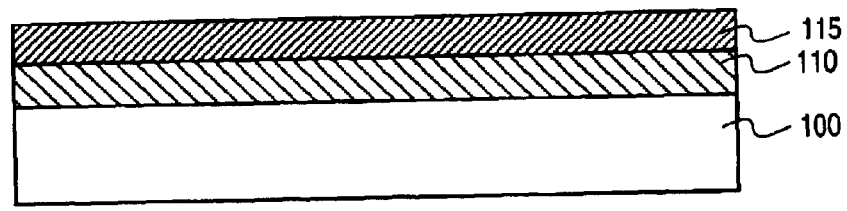
FIG. 3 is the interconnection stack of FIG. 2 after the further processing step of patterning an Al-0.5% Cu alloy in accordance with an embodiment of the invention.

Titanium-nitride layer 115 is then deposited using, for example, an atmosphere of argon and nitrogen at a total pressure of 5 mTorr for 10 seconds to form overlying titanium-nitride layer 115 having a thickness of about 200 Å as shown in FIG. 3.

Figure 4:
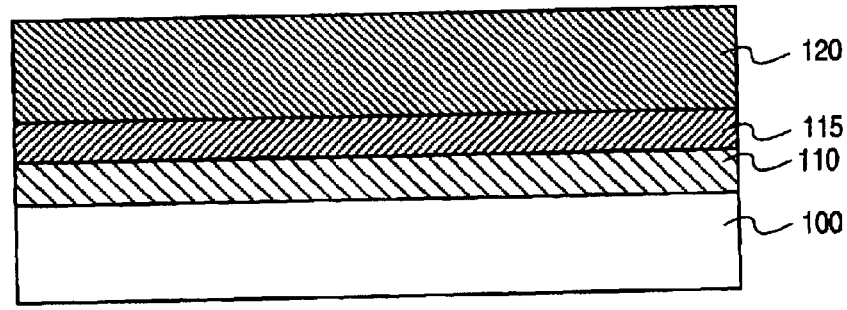
FIG. 4 is the interconnection stack of FIG. 2 after the further processing step of patterning a titanium-nitride (TiN) interlayer in accordance with an embodiment of the invention.

FIG. 4 shows the interconnection stack after the further processing step of depositing an aluminum-copper-Group IV metal layer 120 on the surface of titanium-nitride layer 115. In one embodiment, the Group IV metal is titanium so that metal layer 120 is an aluminum-copper-titanium (Al—Cu—Ti) alloy. One embodiment of this alloy is a Al-0.5% Cu-0.1% Ti alloy. The percentages are atomic percentages of the individual atoms. Other atomic percentages of titanium, preferably less than the maximum solid solubility titanium in the alloy, may be used. Further, various atomic percentages of copper may also be used relative to its solid solubility and the desired resistivity properties of the interconnection. Al—Cu—Ti metal layer 120 is deposited in this embodiment, to a thickness of, for example, approximately 4100 Å using DC magnetron sputtering in an atmosphere of argon under conditions of a total pressure of 5 mTorr, and a deposition rate of 250 Å/second.

Figure 5:
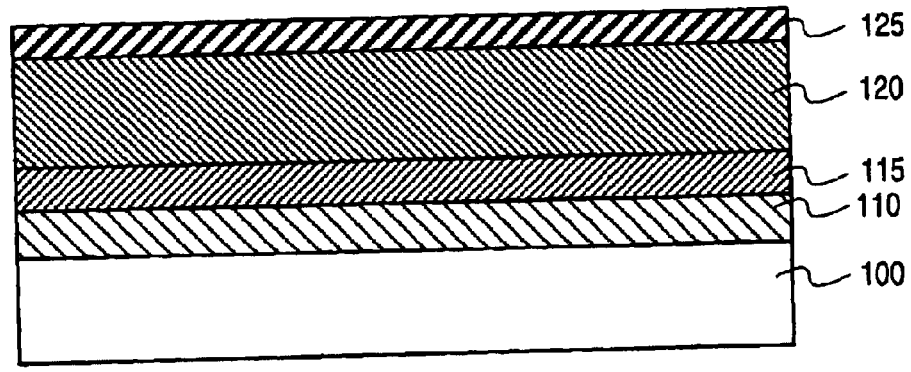
FIG. 5 is the interconnection stack of FIG. 2 after the further processing step of patterning an Al-0.5% Cu alloy in accordance with an embodiment of the invention.
Figure 6:
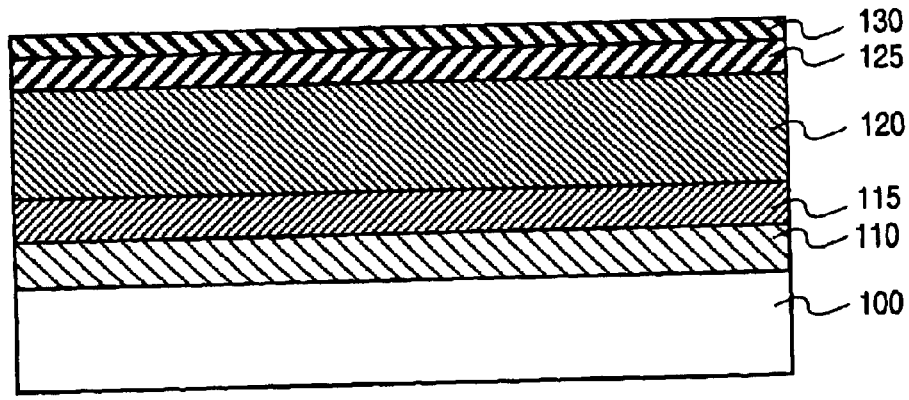
FIG. 6 is the interconnection stack of FIG. 2 after the further processing step of patterning of a Al-0.5% Cu-0.1% Ti alloy in accordance with an embodiment of the invention.

FIG. 5 shows the interconnection stack after the further processing step of depositing titanium layer 125 over metal layer 120. In one embodiment, titanium layer 125 is deposited to a thickness of about 150 Å in a manner similar to that described above with reference to titanium layer 110. FIG. 6 shows the interconnection stack after the further processing step of depositing titanium-nitride layer 130 to a thickness of, in one embodiment, approximately 100 Å, in a manner similar to that described above with reference to titanium-nitride layer 115 on the surface of the interconnection stack to form an about 100 Å thick titanium-nitride layer 130.

An embodiment of the interconnection stack of the invention as described above was evaluated against four other interconnections. The samples were tested at 225° C. in an electromigration testing device. To determine electromigration, the test applied a current density of 2.5 milliamps per centimeter squared (MA/cm$^2$) to a thirty percent rise in resistance on an interconnection formed of single level structures having a length of 1,000 microns and a width of 0.75 microns with the particular interconnection thickness indicated in angstroms (Å). Single level structures were used to omit blocking boundaries since blocking boundaries, formed, for example, when vias are used with tungsten, block the flow of aluminum atoms. Seven lines of each sample were tested and the tests were stopped after 4,000 hours.

Table I indicates the numeric results of testing the five samples as well as a description of each multilayer structure sample.

TABLE I

| SAMPLE | MTTF | 95% LCL | 95% UCL | DESCRIPTION |
|---|---|---|---|---|
| 1 | 400 | 295 | 542 | 1000 Å TaAl/4400 Å Al/150 Å Ti/100 Å TiN |
| 2 | 634 | 478 | 341 | 150 Å Ti/4400 Å Al—0.5%Cu/150 Å Ti/100 Å TiN |
| 3 | 708 | 638 | 786 | 400 Å Ti/200 Å TiN/2000 Å Al—0.5% Cu/200 Å TiN/2000 Å Al—0.5% Å Ti/100 Å TiN |
| 4 | 1132 | 927 | 1383 | 400 Å Ti/200 Å TiN/5500 Å Al—0.5% Cu/150 Å Ti/100 Å TiN |
| 5 | 2527 | 1943 | 8286 | 400 Å Ti/200 Å TiN/4100 Å Al—0.5% Cu—0.1% Ti/150 Å Ti/100 Å TiN |

Sample 1 was a multilayer interconnection structure (or stack) comprised of an amorphous 1000 Å Ta—Al underlayer, a 4400 Å layer of aluminum overlying the Ta—Al underlayer with 150 Å of titanium overlaying the aluminum layer and a 100 Å titanium-nitride (TiN) layer overlaying the titanium layer.

Sample 2 was a multilayer interconnection structure formed by depositing 4400 Å of Al-0.5% Cu onto 150 Å of titanium and overlaying the Al-0.5% Cu with 150 Å of titanium, which itself was overlain by a 100 Å TiN layer.

Sample 3 was a multilayer interconnection structure essentially formed by dividing the Al—Cu layer of Sample 2 with a TiN layer. Sample 3 was formed by depositing 2000 Å of Al-0.5% Cu onto 200 Å TiN which itself was deposited onto 400 Å of titanium. The Al-0.5% Cu was overlain with 200 Å TiN which itself was overlain by a 150 Å of titanium. This 150 Å of titanium was then overlain by a 100 Å TiN layer.

Sample 4 was a multilayer interconnection structure formed, as described above with reference to FIGS. 2–6 and the accompanying text, by depositing 200 Å of TiN onto a 400 Å titanium layer. Overlaying the TiN layer was 5500 Å of Al-0.5% Cu. Overlaying the Al—Cu layer was 150 Å of titanium, which itself was overlain by a 100 Å TiN layer.

Sample 5 was a multilayer interconnection structure of an embodiment of the invention formed by depositing 4100 Å of Al-0.5% Cu-0.1% Ti of TiN overlaying a 400 Å titanium layer. Overlaying the Al—Cu—Ti layer of Sample 5 was 150 Å of titanium, which itself was overlain by a 100 Å TiN layer.

Figure 7:
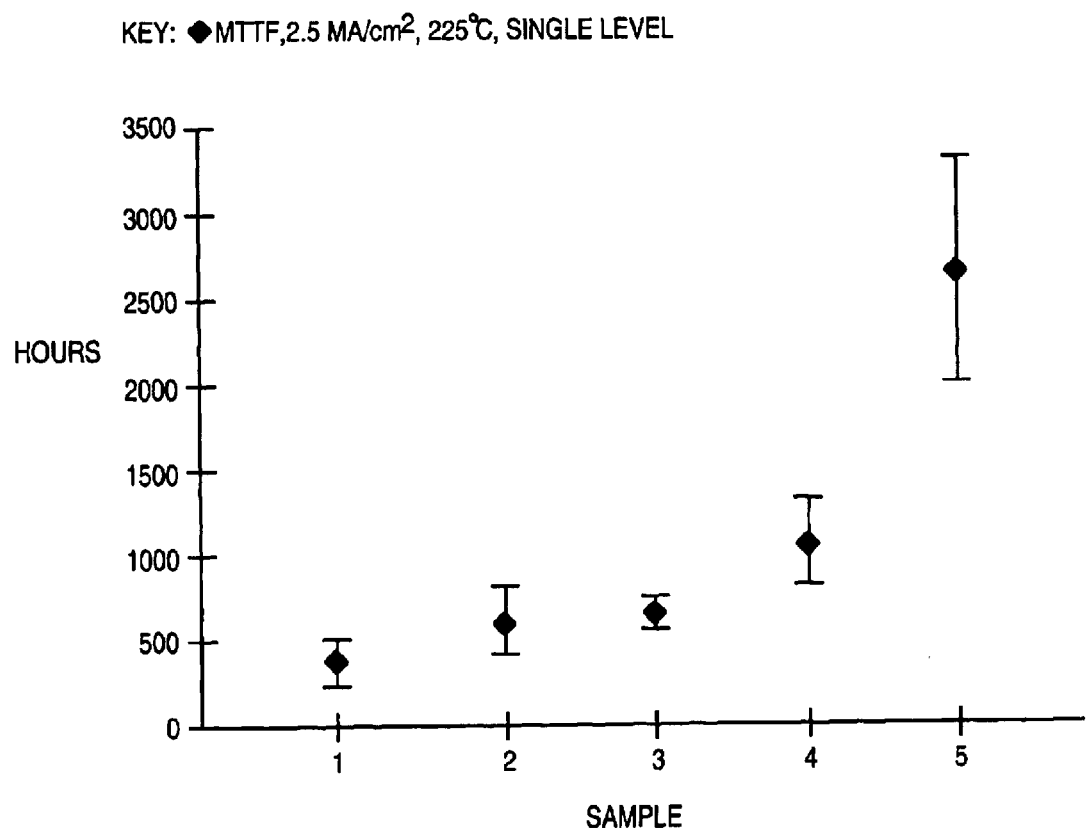
FIG. 7 is a graphical comparison of the electromigration lifetime for various interconnections.

The results of the evaluation of the interconnection stack of the invention and the four other interconnections are summarized in FIG. 7 and Table I. FIG. 7 is a graph that shows the electromigration lifetime for each of the five samples tested. Indexed to the vertical axis of the graph in FIG. 7 are error bars that span the 95% Lower Confidence Limit (LCL) to the 95% Upper Confidence Limit (UCL) and indicates the Mean Time To Failure (MTTF) in test run time hours.

As can be seen in FIG. 7, the most striking result was the electromigration lifetime of the sample of the embodiment of the invention (Sample 5). One might expect that the addition of copper and titanium to aluminum possibly might achieve additive electromigration results (for example, increase in electromigration lifetimes proportional to the concentrations) given the known properties of Al—Ti and Al—Cu. However, as can be seen from Table I and FIG. 7, the results were multiplicative such that the electromigration lifetime for an aluminum alloy interconnection according to the invention was increased by at least a factor of two. Even more dramatic, the increase in lifetime by a factor of two underestimates the true MTTF since three of the seven Al-0.5% Cu-0.1% Ti alloy lines tested were still running at the time the tests were stopped, here 4000 hours.

One reason for the electromigration lifetime success of the interconnection of the invention may be that the amount of titanium added to the Al-0.5% Cu alloy keeps the copper in the Al-0.5% Cu-0.1% Ti alloy from diffusing into the surrounding layers. Titanium reacts with aluminum to form $TiAl_3$. With copper present, the titanium will react with the aluminum to form the complex $Ti(Al, Cu)_3$. Thus, from the standard interconnection alloy of Al-0.5% Cu, the addition of titanium allows approximately 0.2% of the 0.5% Cu to be maintained within the aluminum-copper-titanium alloy as $Ti(Al,Cu)_3$.

It is generally known that acceptable resistivity can be maintained in aluminum alloys by selecting an additive with a low maximum solid solubility. A low solid solubility (for example, on the order of less than one percent) tends to keep the lattice of the aluminum matrix from being distorted. Instead, precipitates tend to form or the solute segregates at the grain boundaries. It has been found that precipitates do not have a detrimental effect on the resistivity and can potentially improve the electromigration lifetime as well as the stress-induced voiding lifetimes.

It is known that the maximum solid solubility of titanium in pure aluminum is 0.57% and the residual resistivity is about 2.9 $\mu\Omega$-cm per 0.5% titanium, depending upon the desired characteristics of the stacking material. In one embodiment, the amount of titanium present in the interconnection of the invention is 0.57 at· % or less.

Resistivity and transmission electron microscope (TEM) measurements of the Al-0.5% Cu-0.1% Ti alloy layer (from the multilayer interconnection structure described above) were evaluated. When taking into account the 0.81 $\mu\Omega$-cm/ at· % residual resistivity of copper in aluminum, one could expect that the maximum solid solubility of titanium in pure aluminum would result in a higher resistivity than observed in the Al—Cu—Ti alloys. In this case, the resistivity would be about 3.5 $\mu\Omega$-cm. Measurements of the resistivity of Al-0.5% Cu-0.1% Ti, however, were found to be similar to Al-0.5% Cu with values of 2.8 to 3.1 $\mu\Omega$-cm.

TEM measurements of the interconnection of the invention were conducted to evaluate the physical properties of the alloy layer. Viewing the sample through a TEM showed no discernible difference in precipitate distribution between the Al-0.5% Cu-0.1% Ti alloy sample of the invention and a Al-0.5% Cu sample. Thus, the addition of 0.1% titanium to the traditional Al-0.5% Cu unexpectedly increases the lifetime of the interconnection by a factor of at least two while maintaining the resistivity and the texture of the interconnection.

A specific embodiment of the interconnection comprising an aluminum-copper-titanium alloy layer according to the invention has been described for the purpose of illustrating the manner in which the invention may be made and used. It should be understood that implementation of other variations and modifications of the invention and its various aspects will be apparent to those skilled in the art, who may develop a variation of structural details without departing from the principles of the invention. For example, the similarity between titanium and the other Group IVA metals or other metals such as tantalum similarly make such metals adequate to alloy with aluminum-copper to increase the electromigration lifetime of an interconnection in a similar fashion. Further, the combination of the Al—Cu-Group IVA alloy in an interconnection stack need not be limited to a Ti/TiN stack, but may be employed with various other stack materials depending upon the desired characteristics of the stacking materials.

What is claimed is:

1. An interconnection comprising:
    an aluminum copper titanium alloy layer, wherein the aluminum-copper-titanium alloy layer comprises less than 0.57 atomic percent titanium, about 0.5 atomic percent copper and the remainder is aluminum, and wherein 0.2 percent of the 0.5 percent copper is maintained within the aluminum-copper-titanium alloy as $Ti(Al, Cu)_3$.

2. The interconnection of claim 1, wherein the aluminum-copper-titanium alloy layer comprises about 0.1 atomic percent titanium.

3. The interconnection of claim 1, further comprising:
    a first titanium layer;
    a first titanium-nitride layer;
    a second titanium layer; and
    a second titanium-nitride layer,
        wherein the second titanium-nitride layer overlies the second titanium layer, the aluminum-copper-titanium alloy layer overlies the second titanium-nitride layer, the first titanium layer overlies the aluminum-copper-titanium alloy layer, and the first titanium-nitride layer overlies the first titanium layer.

4. The interconnect of claim 1, wherein the aluminum-copper-titanium alloy has a resistance in the range of 2.8 to 3.1 micro Ohm-cm.

5. An interconnection formed on a substrate of an integrated circuit comprising an aluminum-copper-titanium alloy layer, wherein the aluminum-copper-titanium alloy layer comprises less than 0.57 atomic percent titanium, about 0.5 atomic percent copper and the remainder is aluminum, and wherein 0.2 percent of the 0.5 percent copper is maintained within the aluminum-copper-titanium alloy as $Ti(Al, Cu)_3$.

6. The interconnection of claim 5, wherein the aluminum-copper-titanium alloy layer contains about 0.1 atomic percent titanium.

7. The interconnection of claim 6, further comprising:
    a first titanium layer;
    a first titanium-nitride layer;
    a second titanium layer; and
    a second titanium-nitride layer,
        wherein the second titanium-nitride layer overlies the second titanium layer, the aluminum-coppertitanium alloy layer overlies the second titanium-nitride layer, the first titanium layer overlies the aluminum-copper-titanium alloy layer, and the first titanium-nitride layer overlies the first titanium layer.

8. An integrated circuit comprising:

a substrate; and an interconnection level disposed about the substrate, the interconnection level having an aluminum-copper-titanium alloy layer, wherein the aluminum-copper-titanium alloy layer comprises less than 0.57 atomic percent titanium, about 0.5 atomic percent copper and the remainder is aluminum, and wherein 0.2 percent of the 0.5 percent copper is maintained within the aluminum-copper-titanium alloy as Ti(Al, Cu)$_3$.

9. The integrated circuit of claim 8, wherein the aluminum-copper-titanium alloy layer contains about 0.1 atomic percent titanium.

10. A multilayered interconnection structure formed on a substrate, the interconnection comprising:

a first titanium layer;

a first titanium nitride layer;

an aluminum-copper-titanium alloy layer, wherein the aluminum-copper-titanium alloy layer comprises less than 0.57 atomic percent titanium, about 0.5 atomic percent copper and the remainder is aluminum, and wherein 0.2 percent of the 0.5 percent copper is maintained within the aluminum-copper-titanium alloy as Ti(Al, Cu)$_3$;

a second titanium layer; and a second titanium nitride layer.

11. The multilayer structure of claim 10, wherein the aluminum-copper-titanium alloy layer contains 0.1 atomic percent titanium.

12. The multilayered structure of claim 10, wherein the aluminum-copper-titanium alloy layer comprises about 0.5 atomic percent copper and about 0.1 atomic percent titanium.

13. The multilayer structure of claim 10, wherein the second titanium-nitride layer overlies the second titanium layer, the aluminum-copper-titanium alloy layer overlies the second titanium-nitride layer, the first titanium layer overlies the aluminum-copper-titanium alloy layer, and the first titanium-nitride layer overlies the first titanium layer.

* * * * *